(12) United States Patent
Li et al.

(10) Patent No.: US 7,215,266 B2
(45) Date of Patent: May 8, 2007

(54) HYBRID DC OFFSET CANCELLATION SCHEME FOR WIRELESS RECEIVER

(75) Inventors: Kuangyu Li, Glendale, CA (US);
Song-Nien Tang, Hsinchu (TW);
Jackie K. Cheng, Irvine, CA (US);
Zaw Min Soe, Encinitas, CA (US)

(73) Assignee: Wionics Research, Irvine, CA (US)

( * ) Notice: Subject to any disclaimer, the term of this patent is extended or adjusted under 35 U.S.C. 154(b) by 0 days.

(21) Appl. No.: 10/851,307

(22) Filed: May 21, 2004

(65) Prior Publication Data

US 2005/0258989 A1 Nov. 24, 2005

(51) Int. Cl.
*H03M 1/06* (2006.01)

(52) U.S. Cl. .................. 341/118; 341/119; 341/120

(58) Field of Classification Search ............... 341/118, 341/119, 120; 455/296; 375/346
See application file for complete search history.

(56) References Cited

U.S. PATENT DOCUMENTS

| | | | |
|---|---|---|---|
| 4,922,195 A * | 5/1990 | Cox | 324/772 |
| 5,617,060 A | 4/1997 | Wilson et al. | |
| 5,724,653 A * | 3/1998 | Baker et al. | 455/296 |
| 6,013,958 A | 1/2000 | Aytur | |
| 6,148,047 A * | 11/2000 | Mohindra | 375/346 |
| 6,324,231 B1 | 11/2001 | Huang | |
| 6,442,380 B1 | 8/2002 | Mohindra | |
| 6,498,929 B1 * | 12/2002 | Tsurumi et al. | 455/296 |
| 6,549,054 B2 | 4/2003 | Ono | |
| 6,735,422 B1 * | 5/2004 | Baldwin et al. | 455/232.1 |
| 2003/0133518 A1 | 7/2003 | Koomullil et al. | |
| 2003/0174079 A1 | 9/2003 | Soltanian et al. | |

FOREIGN PATENT DOCUMENTS

DE 41 33 619 A1 * 5/1992

OTHER PUBLICATIONS

Ueno et al. (U.S. Appl. No. 10/200,405), "Variable Gain Amplifier", filed on Jul. 23, 2002.*
Lin et al. (U.S. Appl. No. 10/228,780), "Zero intermediate frequency to low intermediate frequency receiver architecture", filed on Aug. 26, 2002.*
Murakami et al. (U.S. Appl. No. 10/422,953), "Semiconductor integrated circuit device and wireless communicaiton system", filed on Apr. 25, 2003.*
Yuasa et al. (U.S. Appl. No. 10/491,625), "Direct conversion Receiver", filed on Oct. 25, 2002.*
Kim (U.S. Appl. No. 10/020,332), "Direct conversion receiver for removing DC offset", filed on Dec. 12, 2001.*

(Continued)

*Primary Examiner*—Jean Bruner Jeanglaude
(74) *Attorney, Agent, or Firm*—Christie, Parker & Hale, LLP

(57) ABSTRACT

Systems and methods for canceling static and dynamic DC offsets by combining a digital DC offset correction scheme with an analog DC offset correction scheme. A feedback-based digital DC offset correction scheme provides different adjustment levels for a plurality of discrete gain states and the analog DC offset correction scheme operates in different cancellation modes dependent on a frame structure. A digital DC offset correction scheme collects DC offset control information and provides adjustment levels. In addition, a negative-feedback based switchable high pass filter has a plurality modes of operation, where one mode of operation includes an all-pass filter.

11 Claims, 5 Drawing Sheets

OTHER PUBLICATIONS

International Search Report for International Application No. PCT/US2005/017973, filed May 19, 2005, International Search Report dated Aug. 11, 2005 and mailed Sep. 19, 2005 (2 pgs).

Written Opinion of the International Searching Authority for International Application No. PCT/US2005/017973, filed May 19, 2005, Written Opinion mailed Sep. 19, 2005 (5 pgs.).

* cited by examiner

HYBRID DC OFFSET CANCELLATION SCHEME FOR WIRELESS RECEIVER

BACKGROUND OF THE INVENTION

The present invention relates generally to wireless communication systems and methods, and more specifically to DC offset cancellation for a wireless receiver.

Wireless network technology conveniently allows a mobile user to wirelessly connect to a wired network, such as a local area network (LAN). Heterodyne receivers and direct downconversion receivers are generally used to receive wireless transmissions. In a heterodyne receiver, a radio frequency (RF) signal is mixed with a signal from a local oscillator to produce an intermediate frequency (IF) signal. Through various IF stages with mixers, oscillators, and filters, the IF signal eventually is downconverted to a baseband signal for further processing. Direct downconversion receivers (DCR) directly downconvert a received RF signal to a baseband signal without additional signal processing at various IF stages. The signal is then amplified by a gain to achieve optimal signal strength before presentation to a digital detector or demodulator for further processing.

Both heterodyne receivers and DCRs suffer from same drawbacks. One such drawback is DC offset. DC offset may arise from various sources. Static DC offset (also referred to as coarse DC offsets) may occur due to, for example, temperature, differential input stages, and component mismatches in the components of a receiver. Dynamic DC offset (also referred to as residual DC offset) may occur due to, for example, mixing of the incoming signal with the signal leaked from components of a receiver or signal reflections.

Leakage in components and substantial amplification required to achieve optimal signal strength may result in a large amount of static and dynamic DC offset in a receiver. Without an adequate DC offset correction scheme to remove both static and dynamic DC offset, DC offset may result in loss of information in an incoming signal by generating a large amount of in-band harmonic distortions. Moreover, due to the high data rate often required in a wireless system, DC offsets generally should be quickly removed before interfering with data portions of incoming signals.

BRIEF SUMMARY OF THE INVENTION

The invention provides methods and systems for removing DC offset in a receiver. One aspect of the invention provides a DC offset cancellation system comprising a mixer receiving a high frequency signal and a local oscillator signal and providing a downconverted signal; a variable amplifier receiving the downconverted signal and providing an amplified downconverted signal, the magnitude of amplification being based on a gain value associated with selected discrete gain state of a plurality of discrete gain states; a DC offset measurement circuit, in data communication with the variable amplifier, measuring DC offset for the selected discrete gain state and generating DC offset control information based on the measured DC offset; a memory storing discrete gain values associated with the discrete gain state, the discrete gain values being affected by the DC offset control information; and an automatic gain controller circuit selecting a discrete gate state from the plurality of the discrete gain states.

Another aspect of the invention provides a method for reducing DC offset, the method comprising sweeping through a plurality of discrete gain states; measuring DC offset for each of the plurality of discrete gain states; generating DC offset control information using the measured DC offset; adjusting a gain value associated with each discrete gain state using the DC offset control information; selecting a gain state; and providing the gain value associated with the selected gain state.

Another aspect of the invention provides a DC offset cancellation system comprising: a digital DC offset measurement circuit providing different adjustment levels for a plurality of discrete gain states; and an analog filter removing residual DC offset in conjunction with the digital DC offset measurement circuit. Another aspect the invention provides a method of correcting DC offset, the method comprising: generating DC offset control information for each of a plurality of discrete gain states; turning on a first mode of operation having a fast DC offset cancellation settling time; providing different adjustment levels derived from the DC offset control information for a gain state selected from the plurality of discrete gain states in conjunction with the first mode of operation; and switching to a second mode of operation having a slower DC offset cancellation settling time upon completion of the adjustment operation.

Another aspect of the invention provides a method of correcting DC offset, the method comprising: turning on a first mode of operation having a fast DC offset cancellation settling time before arrival of a frame in conjunction with a gain adjustment operation; switching to a second mode of operation having a slower DC offset cancellation settling time upon completion of the gain adjustment operation; and switching to a third mode of operation of the analog high pass filter having an all-pass filter before the end of a short preamble in the frame.

These and other aspects will be more readily apparent in view of this disclosure, including and in view of the accompanying drawings.

DETAILED DESCRIPTION

Figure 1:
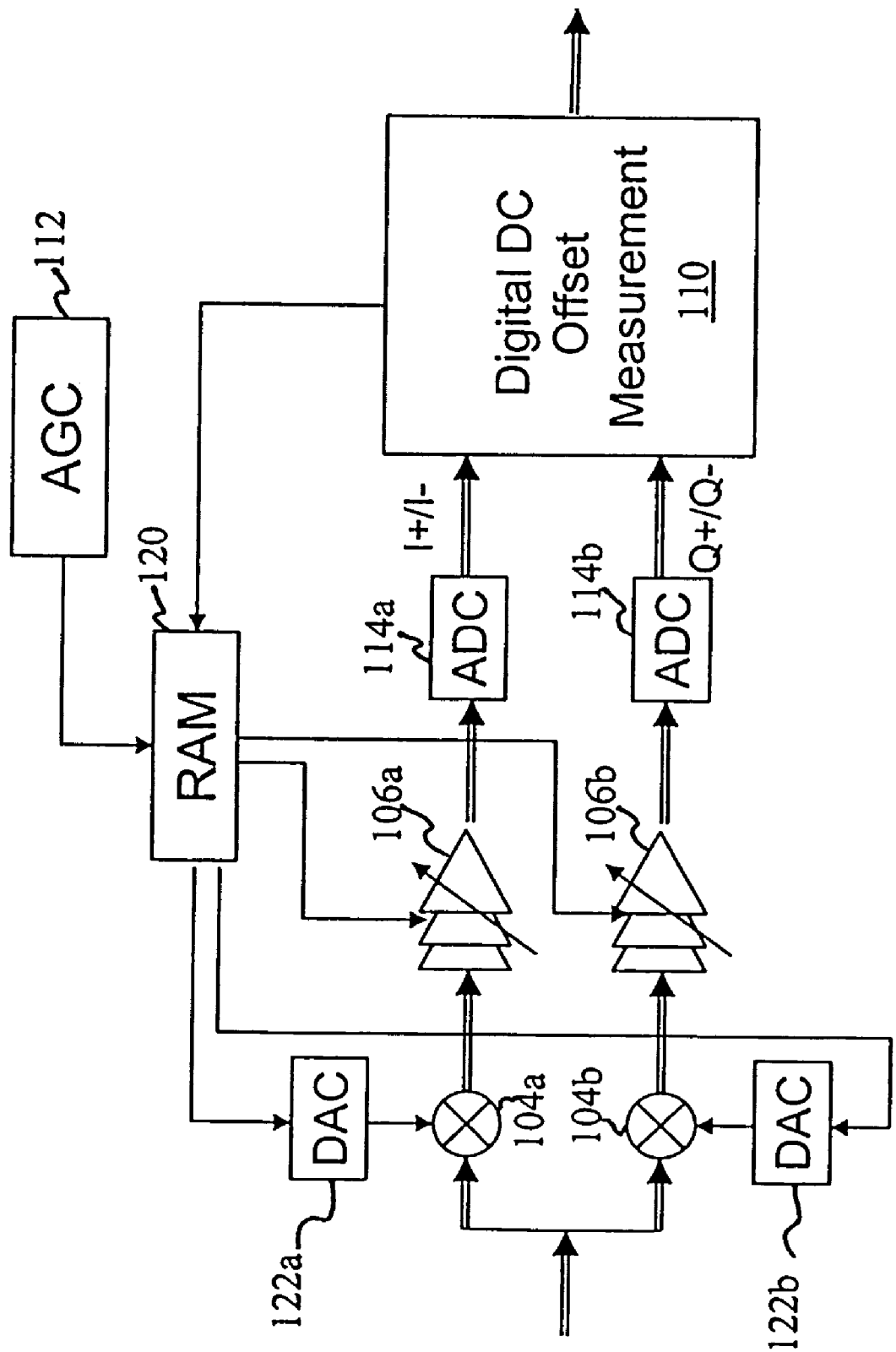
FIG. 1 is a schematic diagram depicting an embodiment of a receiver in a communication system in accordance with aspects of the invention.

FIG. 1 illustrates an embodiment of a receiver in a communication system in accordance with aspects of the invention. As illustrated, the receiver is a direct downconversion receiver. In other embodiments the receiver is a heterodyne receiver. The receiver receives an RF signal, downconverts the RF signal using mixers, amplifies the downconverted signal, and converts the amplified downconverted signal to a digital signal. The RF signal is in quadrature so processing is performed for both an I-channel and a Q-channel. Accordingly, the receiver includes an RF antenna (not shown), an I-channel mixer 104a and a Q-channel mixer 104b, collectively referred to as the mixers 104, an I-channel amplifier 106a and a Q-channel amplifier 106b, collectively referred to as the amplifiers 106, and an I-channel analog-to-digital converters 116 ("ADC") and a Q-channel 114, collectively referred to as the ADCs 114.

The receiver also includes various processing circuitry for processing received digitized information. The circuitry is implemented in some embodiments as discrete circuitry but more generally as part of a processor or a combination of a processor and discrete circuitry. The digital circuitry in various embodiments includes demappers, framers, and other blocks commonly used to process received signals. The receiver also performs DC offset calculations. Accordingly, the digital circuitry includes a digital DC offset measurement block 110.

In some embodiments, the communication system is implemented for use with a wireless networking protocol, such as IEEE 802.11 (e.g., 802.11a, 802.11b, 802.11g) or other protocol. In typical implementations, the communication system of FIG. 1 operates in a radio frequency based network. In one embodiment, a source (not shown) provides a data stream in a digital format. The source in some embodiments is a computer system, a personal digital device that has wireless communication capability, or other digital device of subsystem of such a device. The source provides information in a digital form to, for example, a QAM (quadrature amplitude modulation) modulator (not shown). The QAM modulator receives the information in digital form and modulates the digital signal to form an analog signal stream. The QAM modulator then provides the analog signal stream to a transmitter (not shown), which transmits the signal in the radio frequency band.

In the receiver, the RF antenna receives the analog signal stream. The received signal stream is provided to the mixers 104a and 104b. The mixers respectively mix in-phase (I) and quadrature (Q) mixing signals with the received signal. The I and Q mixing signals are provided by local oscillators (LOs) (not shown). The signals provided by the LOs are at substantially the same frequency, the received RF signal's center frequency, but differ in phase. The mixers therefore downconvert the RF signal into two independent baseband I-channel and Q-channel signals. A mixer bias current, or a bias voltage depending on the mixer implementation, is set by a mixer bias signal. The mixer bias signal is based on a discrete bias value selected from a plurality of discrete bias values. An Automatic Gain Control (AGC) block 117 determines which discrete bias value of the plurality of discrete bias values to use. As illustrated in FIG. 1, the mixer bias signal is an analog signal formed by converting the discrete bias value from digital form by digital to analog converters (DACs) 122a,b. As is later described, the bias value is set to a value expected to reduce DC offset.

The amplifier 106a receives the I-channel signal and provides an amplified I-channel signal. Similarly, the amplifier 106b receives the Q-channel signal to provide an amplified Q-channel signal. The amplifiers may each be a signal stage amplifier, but more commonly, and as illustrated in FIG. 1, the amplifiers are each a chain of amplifiers, at least some of which have a variable gain. Thus, the amplifiers are variable amplifiers, and the magnitude of amplification is set by a gain signal provided to the amplifier. The gain signal may be set to any one of a plurality of discrete gain values. The selection of a particular gain value is determined by the AGC. The gain signal is set, in part, to a value expected to reduce DC offset.

The ADCs 114a, 114b receive the amplified I-channel and Q-channel signals, respectively. The ADC 114a receives the amplified I-channel signal and converts the a signal into a digital I-channel signal having N bits of digital resolution. Similarly, the ADC 114b receives the amplified I-channel signal and converts the analog signal into a digital Q-channel signal having N bits of digital resolution.

The DC offset measurement block receives the digital I-channel signal and the digital Q-channel signal. The DC offset measurement block determines a DC offset of the digital I-channel signal and the digital Q-channel signal. In some embodiments the DC offset measurement block determines the DC offset by performing a Fast Fourier Transition (FFT) for the digital I-channel and Q-channel signals. In such embodiments the DC offset may be determined, for example, by determining the magnitude of a frequency domain signal at or about a zero frequency. In other embodiments other methodologies are used. For example, in some embodiments processing is performed using time domain signals to determine DC offset.

Information regarding the DC offset is used to set the bias signal and the gain signal, in conjunction with the discrete bias and gain values. The discrete values are, in many embodiments, each associated with a corresponding gain state. For example, there may be 30 gain states, with each gain state having an associated bias value and gain value. The values for each gain state are stored in RAM 120, with default values stored at start up.

In some embodiments, and as illustrated in FIG. 1, the DC offset measurement circuit adjusts the values in RAM based on DC offset measurement. In other embodiments the DC offset measurement block stores an indication of measured DC offset in RAM, and a processor (not shown) calculates adjusted gain values using the default settings and/or the indications of measured DC offset.

In operation, before the arrival of a first signal at the receiver, the receiver sweeps through all of the discrete gain states for the amplifiers 106. DC offset measurements are performed while sweeping through each gain state. In other words, the AGC selects each gain state for a moment to allow for measurement of DC offset, and the digital offset measurement block 110 determines the DC offset associated with each gain state. The DC offset measurement block 110 generates DC offset information based on the DC offset measurement. The DC offset information is used to adjust the bias values and the gain values. In some embodiments the DC offset information is used to modify entries in a default gain/bias table. In other embodiments the DC offset information is used in conjunction with the default gain/bias table to set a further gain/bias table, with the values provided the mixer and the amplifier selected from the further table. The AGC determines which gain state to use, with the actual gain and bias values dependent on the values stored in the table.

Thus, in some embodiments, during a setting period, which is before the arrival of a signal at the receiver, the digital DC offset measurement block 110 activates a digital feedback loop to collect DC offset information for the plurality of discrete gain states in the RAM 120. In some embodiments, the digital feedback loop is reactivated during an idle time to recalibrate the DC offset information to compensate for variations, such as temperature changes.

Figure 2:
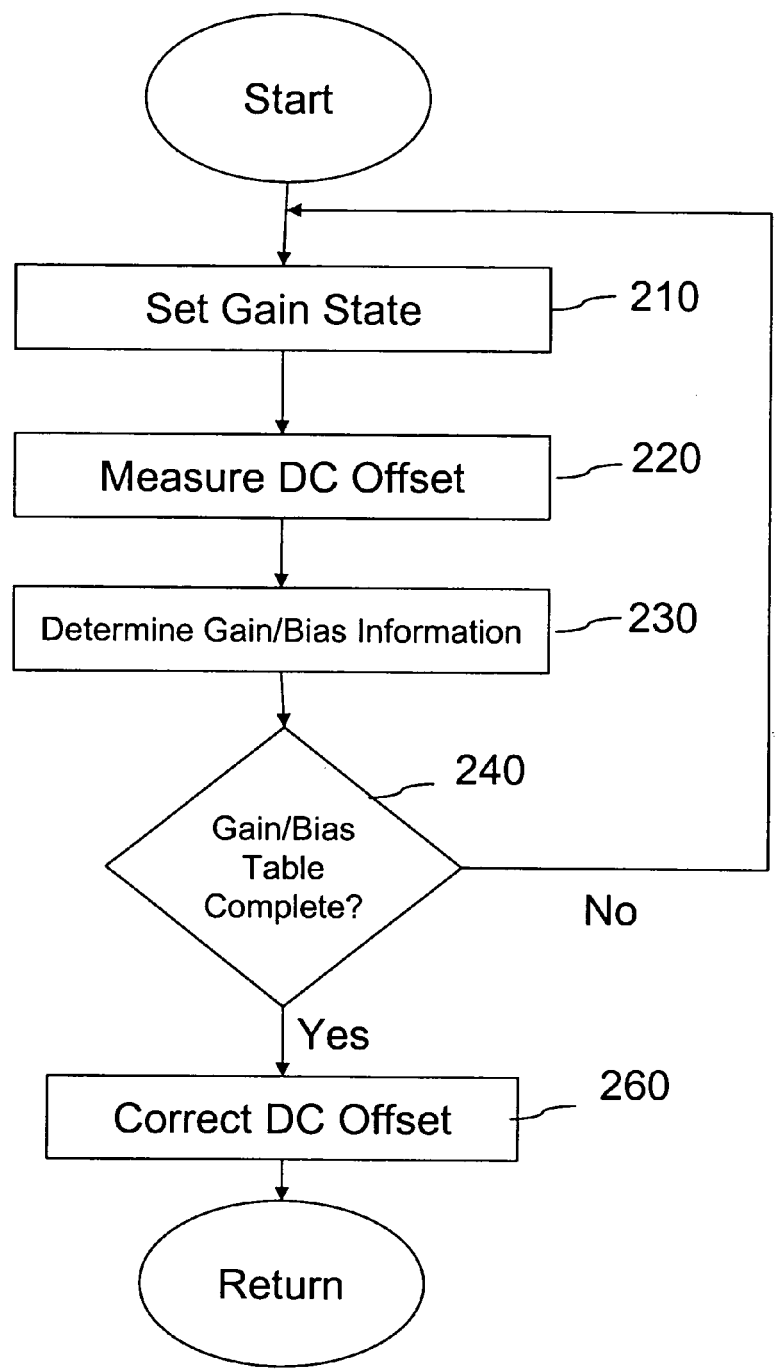
FIG. 2 is a flowchart depicting a process of correcting static DC offset in accordance with aspects of the invention.

FIG. 2 is a flowchart depicting a process of correcting DC offset in accordance with aspects of the invention. In one embodiment, during an initial setting period, which is generally before the arrival of signals at a receiver, discrete gain states are swept through. In other words, default values are used for gain and bias values for each gain state, and each gain state is selected for a predetermined duration. In one embodiment, 30 different combinations of the gain states are available for a variable amplifier, and each gain state is selected for approximately 10 msec. In block 220, DC offset associated with a gain state is measured. In one embodiment, the measurement of DC offset of one gain state takes around 10 msec. In block 230, the DC offset measurement is translated to DC offset control information. The DC offset control information for the measurement and its corresponding gain state pair are stored in a RAM to create a gain/bias lookup table. In some embodiments, DC offset control information is an 8 bit or 16 bit control word that is placed in RAM, which may be a register, to set a correction level. In some other embodiments, the DC offset control information is a voltage value with a known bit pattern.

In block 240, the process determines if measurements have been taken for all gain states. If the measurements and DC offset control information are complete for all the discrete gain states, then in block 260, the process proceeds with DC offset correction. Otherwise the process returns to block 210. In block 260, the digitized DC offset control information values are converted into bias current or voltage adjustments, which are applied to the mixers and/or the variable amplifiers to modify a bias current or voltage or set an amplification value.

In one embodiment, the process of FIG. 2 is implemented with the circuitry of FIG. 1. Thus, referring also to FIG. 1, in block 210 the AGC selects a gain state. In block 220 the DC offset measurement block determines DC offset for the gain state. The acts of block 210 and 220 are repeated until DC offset, and DC offset gain control information, are determined for each gain state. In a DC offset correction block 260 as illustrated in FIG. 2, the AGC 112 sets a gain signal indicating a gain state for the amplifiers 106 based on the strength of the received signal. In one embodiment, after the AGC 112 sets a gain state, the AGC 112 looks up values in the gain/bias table and reads the corresponding DC offset control information for the gain state selected for the amplifier 106. In another embodiment, the AGC 112 copies the corresponding DC offset control information for the selected gain state. The selected DC offset control information is then translated into bias current or voltage adjustments for the mixers 104 (using the DACs 122) and the amplifiers 106 to correct the DC offset associated with the corresponding gain state. The digital DC offset measurement circuit 110 may also update the gain/offset table periodically. For example, the measurement circuit 110 may remeasure the DC offsets and update the table during an idle time after the end of a first frame, but before the arrival of the second frame to track variations such as time varying changes in the device or the received signal.

Figure 3:
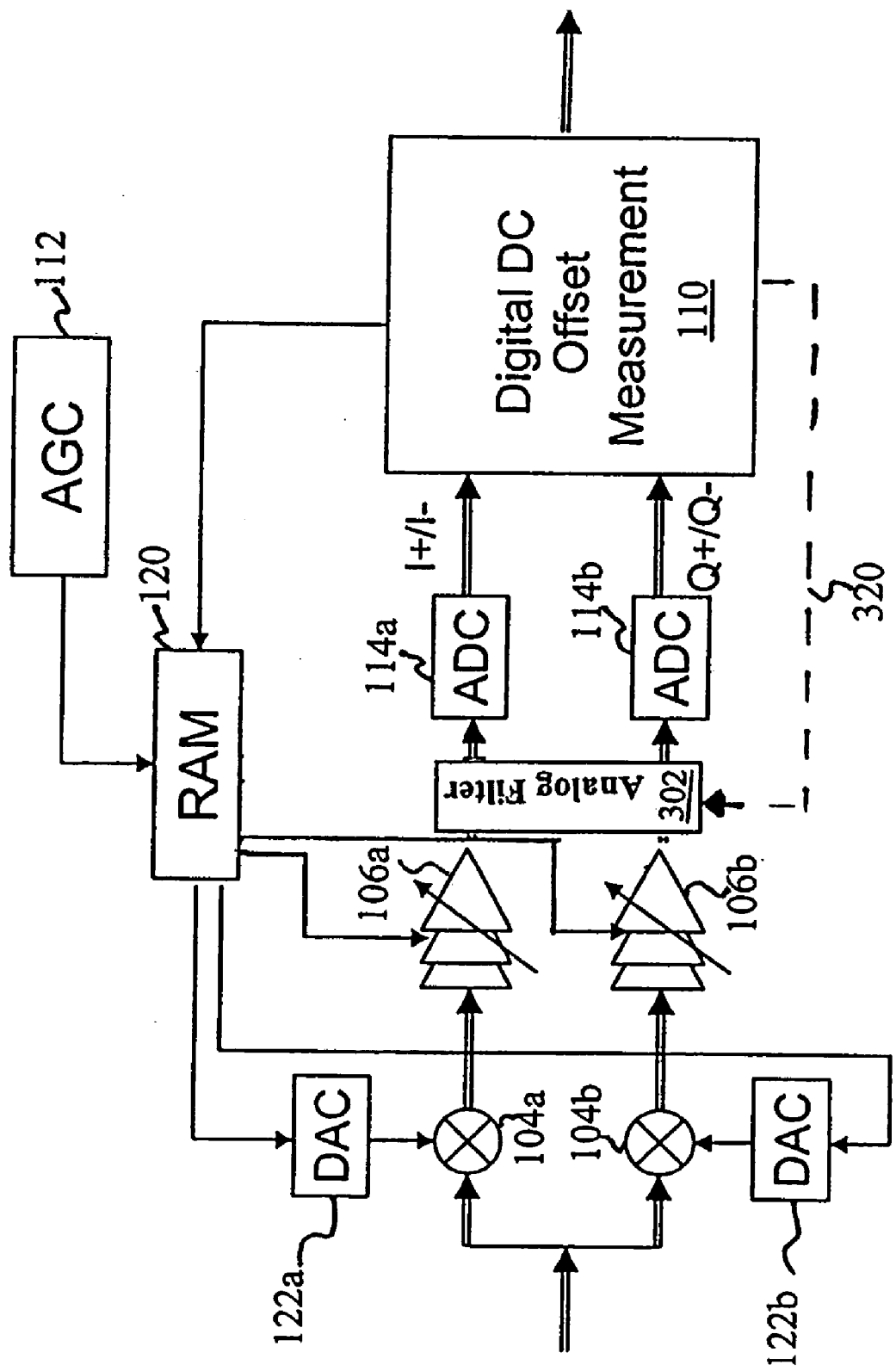
FIG. 3 is a schematic diagram depicting another embodiment of a receiver in a communication system in accordance with aspects of the invention.

FIG. 3 depicts an embodiment of a further receiver in a communication system in accordance with aspects of the invention. As illustrated, the receiver is a direct downconversion receiver using both an analog filter 302 (with an optional feedback loop 320) and a digital DC offset correction circuit with a feedback loop. The analog filter 302 is included in an analog component of the receiver to substantially remove or reduce dynamic DC offset before the DC offset causes distortions in the digital baseband section of the receiver. In one embodiment, the analog filter 302 is a high pass filter placed between the output of the variable gain amplifiers 105 and the input of the ADCs 114.

In one embodiment, the high pass filter 302 is a high pass filter with a fixed corner frequency. In other embodiments, the high pass filter 302 is a high pass filter with a switchable corner frequency implemented either based on an AC-coupled or negative feedback approach. The switchable AC-coupled filter includes a switch, a capacitor, and resistors, and switches the corner frequency by, for example, adjusting the resistor values via the switch. In some embodiments, the switchable AC-coupled filter includes a switch, a resistor, and varactors and switches the corner frequency by adjusting the capacitance of the varactors. In one embodiment, a switchable AC-coupled high pass filter includes a plurality of interconnected AC-coupled high pass filters as described in a patent application entitled "DYNAMIC AC-COUPLED DC OFFSET CORRECTION," U.S. patent application Ser. No. 10/850,774, filed of even date herewith, which is incorporated by reference herein. In a negative-feedback based switchable high pass filter, an equivalent high pass filter is generated via a negative feedback loop 320 (shown in dotted lines).

In the receiver of FIG. 3, an RF antenna (not shown) receives an analog signal stream. The received signal stream is provided to the mixers 104a and 104b. The mixers respectively mix the received signal with in-phase (I) and quadrature (Q) mixing signals provided by local oscillators (LOs). An amplifier 106a for the I-channel signal and an amplifier 106b for the Q-channel signal are coupled to the outputs of the mixers. The amplifiers 106 amplify the baseband signal with a gain state set by the AGC 112. The outputs of the amplifiers 106a, 106b are coupled to the inputs of the analog filter 302. The analog filters removes DC offset, particularly dynamic DC offset, from the baseband signal. The ADCs 114a, 114b are coupled to the outputs of the analog filter 302. The ADCs 114 convert the analog signal into digital signals and directs the digital signals to a digital component. The digital component generally includes processing circuitry, such as FFTs and demappers. In one embodiment, the digital component includes a digital DC offset measurement circuit. The digital DC offset measurement circuit 110 is coupled to the outputs of the ADCs 114 and activates a digital loop to collect DC offset control information associated with the discrete gain states provided by the AGC 112.

Figure 4:
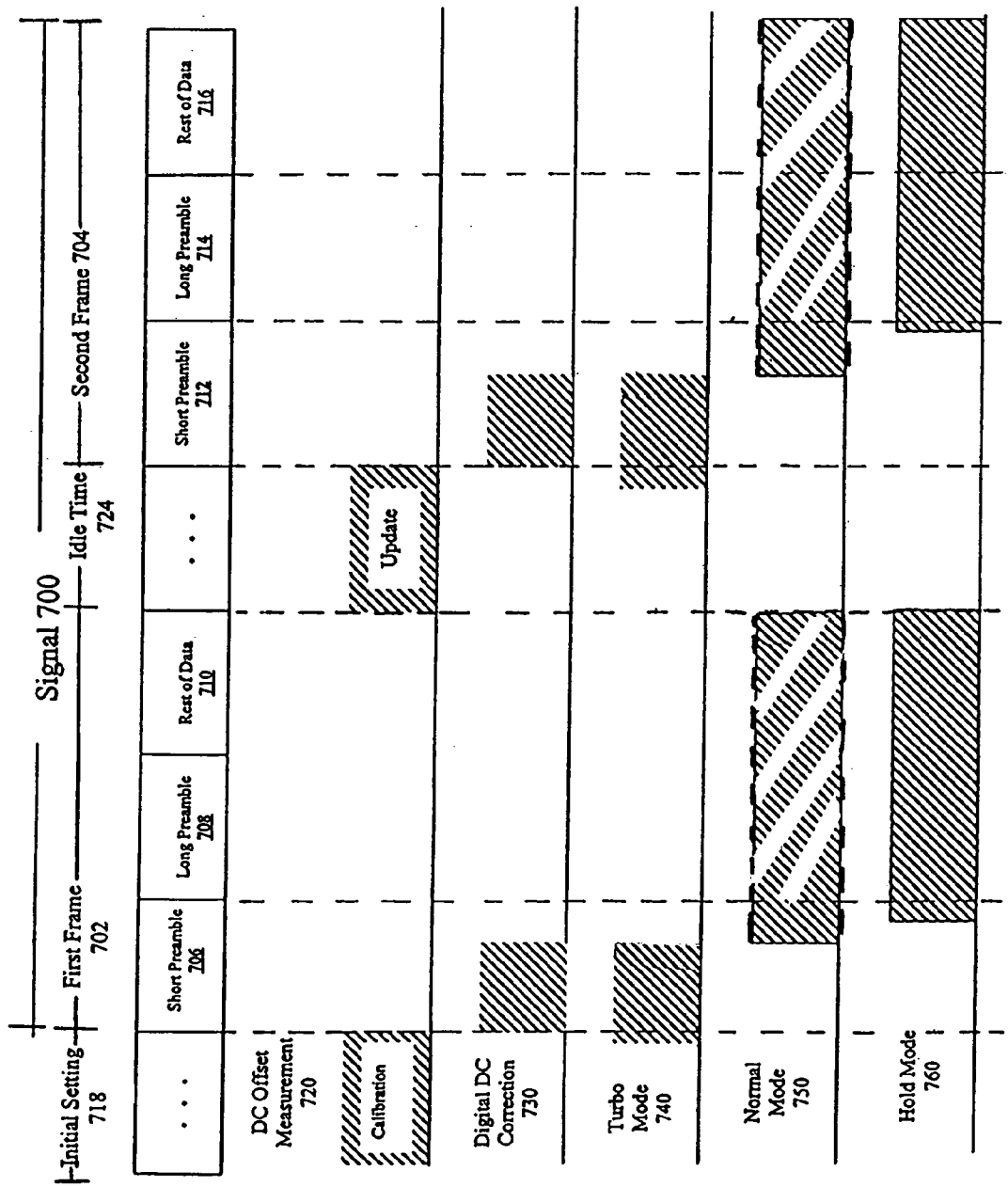
FIG. 4 schematically depicts various signal diagrams of DC offset cancellations being performed on an incoming signal of the receiver in FIG. 3 in accordance with aspects of the invention.

As will be further explained with respect to the discussion of FIG. 4, an exemplary IEEE 802.11 (e.g., 802.11a, 802.11b, 802.11g) frame structure generally may be considered to have three components: a short preamble, a long preamble and data. After an initial setting period, which is generally before the arrival of a first signal at a receiver, the high pass filter 302 turns on a first mode, referred to as a turbo mode, with a high corner frequency to provide a fast DC offset cancellation settling time in conjunction with the gain adjustment operation performed by the AGC. Prior to the end of reception of the short preamble, the high pass filter 302 switches to a second mode of operation (also referred to as a normal mode) with a lower corner frequency to remove the residual DC offset. Preferably, the use of the lower corner frequency reduces the possibility of substantially interfering with the data of the received frame.

Another mode of operation, referred to as an optional hold mode, is in some embodiments available in the negative feedback approach, when the feedback loop is open and becomes an all-pass filter. In this mode, the corner frequency is initially set to zero, with the corner frequency exponentially decreasing as the charged capacitors discharge. In some embodiments, a high pass filter having three modes of operation, the turbo mode, the normal mode, and the hold mode, is used in the receiver without the digital DC offset correction mechanism.

As previously illustrated in FIG. 1, the digital DC offset measurement block 110, in some embodiments, provides coarse adjustment of DC offset by generating DC offset control information, which is used during the automatic gain adjustment operation to remove the DC offset. In some embodiments, however, the DC offset correction block 110 may be implemented with feedback-based average and subtract techniques. In such an embodiment, the DC offset measurement circuit 110 estimates DC offset by averaging the digitized signal formed from the analog baseband signal. The estimated DC offset value is then fed back and subtracted from the down-converted analog signal at the output of the mixers 104.

Thus by simultaneously combining both analog and digital DC offset cancellation mechanisms, a substantial portion of dynamic and static DC offset is removed or reduced during the short preamble phase without interfering with the data of the received signal.

In operation, before the arrival of a first signal at the receiver, the receiver sweeps through all the discrete gain states for the amplifiers 106. The digital offset measurement circuit 110 measures the DC offset associated with each gain state. The DC offset measurement circuit 110 generates DC offset control information from the DC offset measurement. The DC offset control information is used to adjust receiver operation as previously described.

The receiver is set to turbo mode after determination of the DC offset receiver remains in turbo mode, with the analog filter set to a higher corner frequency, during reception of a large part of the short preamble. Towards the end of the short preamble the receiver switches to the normal mode to further remove the residual DC offset by switching to a lower corner frequency. If the optional hold mode is available, before the end of the short preamble, in some embodiments, the analog filter 302 turns off the normal mode and switches to the optional hold mode, if available for the analog filter 302. In optional hold mode the filter is configured as an all-pass filter, and removes residual DC offset while the filters charged capacitors discharge.

FIG. 4 illustrates various signal diagrams of DC offset cancellation operations being performed in the receiver 300 of FIG. 3 in accordance with aspects of the invention. A signal stream 700 approaching the receiver 300 of FIG. 3 includes a number of frames. FIG. 4 shows a first frame 702 and a second frame 704. The first frame 702 and the second frame 704, in an exemplary IEEE 802.11a frame structure, each has three fields: a short preamble 706, 712, a long preamble 708, 714, and data 710, 716, respectively. In the IEEE 802.11a frame structure, the baseband signals in the short preamble 706, 712 are separated by 1.25 MHz and the baseband signals in the long preamble 708, 714 and the data 710, 716 are separated by 312.6 kHz.

Before the arrival of the signal 700, the receiver is turned on to proceed with the initial setting period 718. As shown in a DC offset measurement signal diagram 720, in this period, the digital DC offset measurement circuit 110, takes DC offset measurements at each discrete gain state for the amplifiers 106 provided by the AGC 112, derives DC offset control information from the measurements and stores the information in the RAM 120 to create a gain/offset lookup table. The initial measurements and the gain/offset table are completed before the arrival of the first frame 702. Still referring to the DC offset measurement signal diagram 720, the DC offset measurements are retaken and updated during an idle time 724, after the end of the data 710 of the first frame 702, but before the arrival of the second frame 704, to compensate for variable factors, such as time varying signal changes and temperature changes. Instead of sweeping through all the discrete gain states again, the gain/offset table updates in some embodiments are performed only on a selected number of gain states.

As illustrated in a digital DC correction signal diagram 730, upon arrival of the first frame 702 and in the short preamble phase 706, the digital DC offset correction circuit 110 proceeds with the correction of digital coarse DC offset for each gain adjustment to be made during the AGC 112 operation. The digital DC offset correction and the AGC 112 operations are completed during the short preamble 706. The digital DC offset correction repeats for the short preamble 712 of the second frame 704 during the AGC 112 operation of the second frame 704.

As illustrated in a turbo mode signal diagram 740, the turbo mode of the high pass filter 302 is turned on after the initial setting period to remove the dynamic DC offset. To shorten the DC offset cancellation settling time to quickly remove a substantial portion of the DC offset without interfering with the actual data portion 710 of the frame, a high corner frequency is selected for the high pass filter 302 at the beginning of the short preamble 706. For example, the high corner frequency ranges from hundreds of kHz to a few MHz for IEEE Wireless LAN 802.11a format. The turbo mode is again turned on after receiving the end of data 710 on the first frame 702.

As illustrated in a normal mode signal diagram 750, the turbo mode is turned off and the normal mode is turned on before the end of the short preamble 706 upon completion of the AGC gain adjustment operation. During the normal mode, the corner frequency of the high pass filter is lowered to reduce or have a minimal impact on the signal 700. Because of the change in the corner frequency, the DC offset cancellation settling time will slow down in the analog domain. However, since most of the DC offset preferably has already been removed during the previous operation, the residual DC offset will be small and reducible with a slower cancellation time. The normal mode repeats for the second frame 704 after the completion of turbo mode of the second frame.

As illustrated in a hold mode signal diagram 760, the optional hold mode, generally available for the negative feedback approach, in some embodiments is applied after the normal mode, before the end of the short preamble 706. As described earlier, the hold mode uses charged capacitors to further reduce the DC offset without causing any degradation to the data 710 of the signal 700. The optional hold mode repeats for the second frame 704 after the normal mode operation of the second frame 704.

Figure 5:
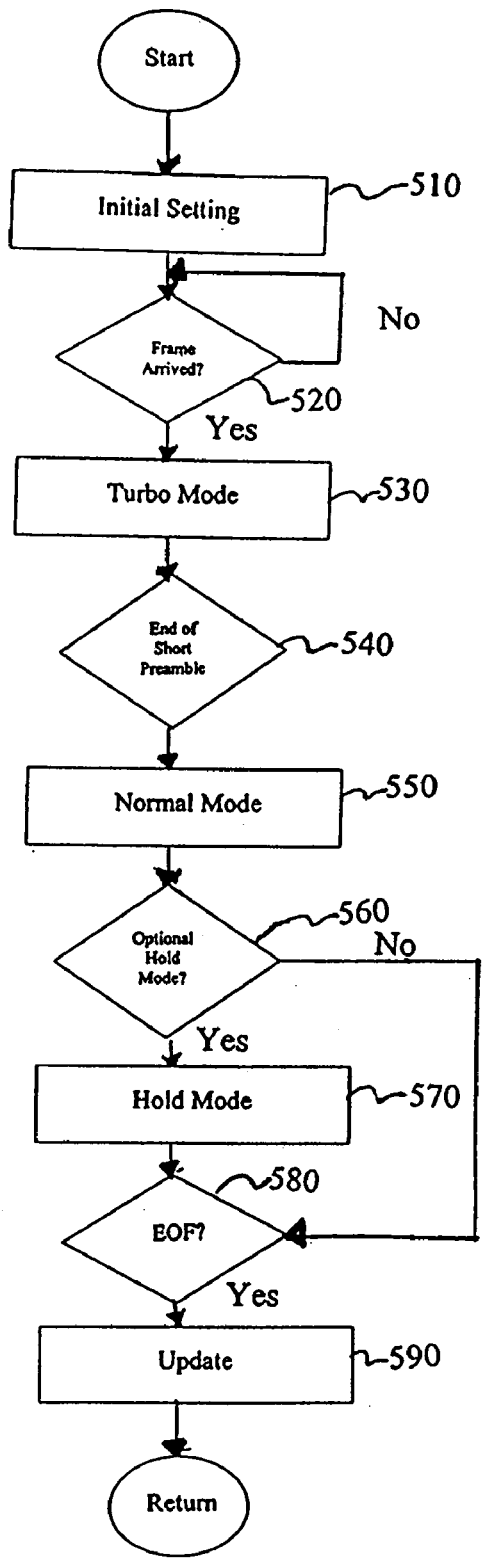
FIG. 5 is a flowchart depicting a process of correcting static and dynamic DC offset in accordance with aspects of the invention.

FIG. 5 is a further flowchart depicting a process of correcting static and dynamic DC offset in accordance with aspects of the invention. A digital DC offset measurement circuit 110 operates in an initial setting block 510. In the initial setting block 510, before arrival of a first frame at a receiver, discrete gain states are swept through and DC offset associated with each gain state is measured. DC offset control information derived from the measurement is recorded to create a gain/offset table. After completing the gain/offset table for all of the discrete gain states for the amplifiers 106, in block 520, the process checks if the first frame has arrived.

In one embodiment, this process is implemented with the digital DC offset measurement circuit 110 and the switchable high pass analog filter 302 of FIG. 3. Upon arrival of the first frame at the receiver, the AGC 112 proceeds with selection of gain states with gain values expected to reduce DC offset. The analog filter 302 complements the digital DC offset correction circuit 110 by removing or reducing residual coarse DC offset. More specifically, after the initial setting period, the analog filter 302, configured as a switchable high pass filter, operates in a turbo mode block 530 with a high corner frequency to provide a fast DC offset cancellation settling. In the turbo mode operation, the analog filter 302 works concurrently with the AGC to substantially remove both static and dynamic DC offset during the short preamble phase without interfering with the data portion of the frame.

The analog filter 302 switches to the normal mode in block 550 by switching to a lower corner frequency and further removing residual DC offset, preferably without substantially interfering with the data field of the received frame.

Also, before the end of the short preamble, in block 560, the process checks if the optional hold mode is available for the analog filter 302. The optional hold mode, an all-pass filter, is generally available for the negative feedback based analog filter 302. If the hold mode is not available, then the normal mode continues until the end of frame. In block 580, the process checks if reached the end of the frame 702, if the end of the frame 702 is not yet reached, the analog filter 302 continues with its current mode. If the end of the frame 702 is reached, the offset/gain table in the RAM 120 is updated in block 590 and the blocks in FIGS. 2 and 5 are repeated for the next frame.

Variations, modifications, and other implementations of what is described herein will occur to those of ordinary skill in the art without departing from the spirit and the scope of the invention as claimed. Although the invention has been described with respect to certain embodiments, it should be recognized that the invention includes the claims and their equivalents supported by this disclosure.

The invention claimed is:

1. A system in a wireless receiver including DC offset cancellation, comprising:
   a mixer receiving a high frequency signal and a local oscillator signal and providing a downconverted signal;
   a variable amplifier receiving the downconverted signal and providing an amplified downconverted signal, the magnitude of amplification being based on a gain value associated with a selected discrete gain state of a plurality of discrete gain states each having an associated stored gain value;
   a DC offset measurement circuit, in data communication with the variable amplifier, measuring DC offset for the selected discrete gain state and generating DC offset control information based on the measured DC offset;
   a high pass filter coupled between the variable amplifier and the DC offset measurement circuit;
   a memory storing the associated stored gain values, the associated stored gain values being affected by the DC offset control information; and
   an automatic gain controller circuit selecting a discrete gate state from the plurality of the discrete gain states.

2. The system of claim 1, wherein the DC offset measurement circuit comprises a Fast Fourier Transform (FFT) block.

3. The system of claim 1, wherein the DC offset measurement circuit comprises a processor.

4. The system of claim 3, wherein the processor performs a Fast Fourier Transform.

5. The system of claim 1, wherein the DC offset measurement circuit updates the DC offset control information.

6. The system of claim 1 further comprising a digital-to-analog converter translating a bias signal associated with the gain value, the bias signal adjusting operation of the mixer.

7. A method of correcting DC offset, the method comprising:
   receiving a radio frequency signal providing information in frames;
   downconverting and amplifying the radio frequency signal, amplification of the radio frequency signal dependent on a gain state selected from a plurality of discrete gain states, each of the discrete gain states having an associated gain value;
   providing the downconverted and amplified signal to a high pass filter with a switchable corner frequency, an output of the high pass filter coupled to an analog-to-digital converter to thereby digitize the downconverted, amplified, filtered signal;
   setting the high pass filter to a first corner frequency; and
   switching the high pass filter to a second corner frequency, lower than the first corner frequency, during reception of a frame.

8. The method of claim 7 further comprising:
   opening a feedback loop of the high pass filter to form an all pass filter during reception of the frame and after switching the high pass filter to the second corner frequency.

9. The system of claim 1 wherein the high pass filter has a switchable corner frequency.

10. The system of claim 9 wherein the corner frequency of the high pass filter is switched from a higher corner frequency to a lower corner frequency during reception of a short preamble of a frame.

11. The system of claim 9 wherein the high pass filter is a negative feedback high pass filter with the feedback path opened during reception of a short preamble of a frame.

* * * * *